United States Patent [19]

Ely et al.

[11] 4,379,968

[45] Apr. 12, 1983

[54] PHOTO-OPTICAL KEYBOARD HAVING LIGHT ATTENUATING MEANS

[75] Inventors: Richard I. Ely, Orange Park; Edward I. Nelson, Sunrise, both of Fla.

[73] Assignee: Burroughs Corp., Detroit, Mich.

[21] Appl. No.: 220,130

[22] Filed: Dec. 24, 1980

[51] Int. Cl.³ .............................................. G01D 5/34
[52] U.S. Cl. .................................. 250/229; 340/365 P
[58] Field of Search ................... 250/221, 229, 237 R; 340/365 P

[56] References Cited

U.S. PATENT DOCUMENTS

| | | | |
|---|---|---|---|
| 3,579,047 | 2/1969 | Sturm et al. | 250/221 |
| 3,668,407 | 6/1972 | Matzen et al. | 250/229 |
| 3,750,150 | 7/1973 | Cramer et al. | 340/365 P |
| 3,818,485 | 6/1974 | Harrison et al. | 340/365 P |

Primary Examiner—David C. Nelms
Attorney, Agent, or Firm—David G. Rasmussen; Carl Fissell, Jr.; Kevin R. Peterson

[57] ABSTRACT

The invention relates to photo-optical detection by coded aperture in which photo-optical keyboard apparatus includes a pattern arrangement of keys in rows and columns wherein each row is provided with a light source or generator optically couplable to a light receiver or receptor and including individual key stems each of which is provided with a light transfer attenuating, limiting or constricting element each element being arranged to pass or restrict a percentage of the light from source to receptor, key to key, by column to row effective to indicate the precise key position or location as a result of the actuation or depression of any key in the pattern arrangement. By electrically multiplexing the light signals a minimum circuit complex is required.

12 Claims, 15 Drawing Figures

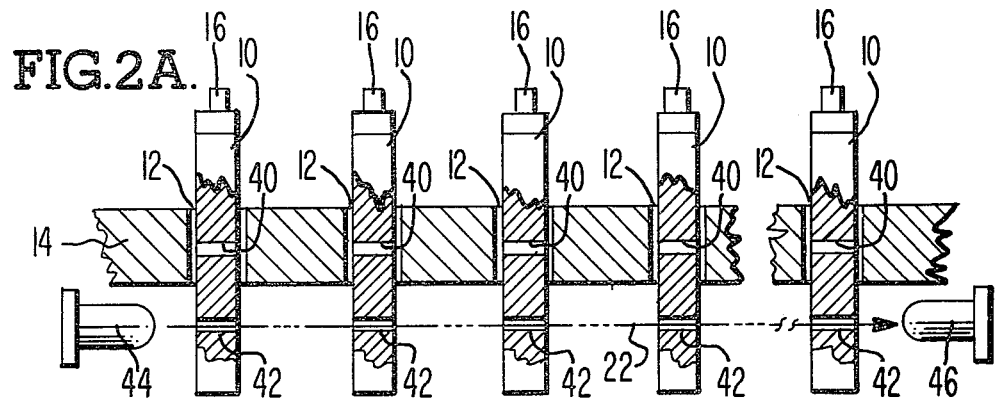
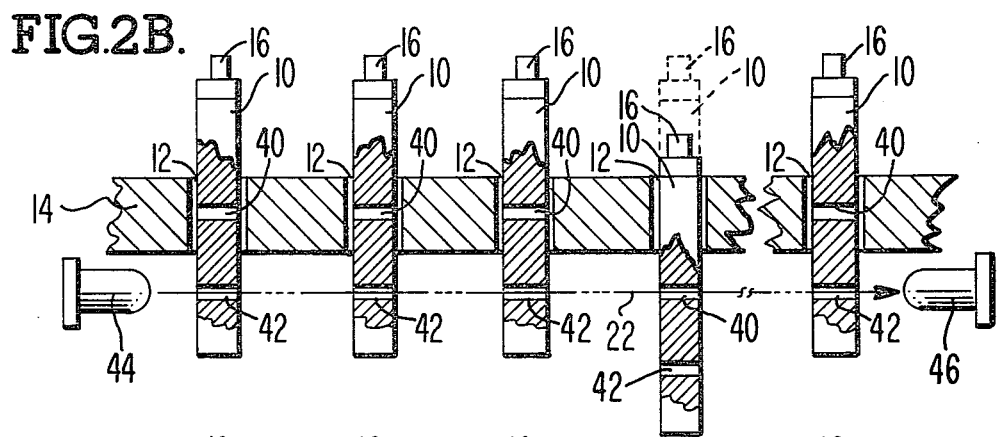
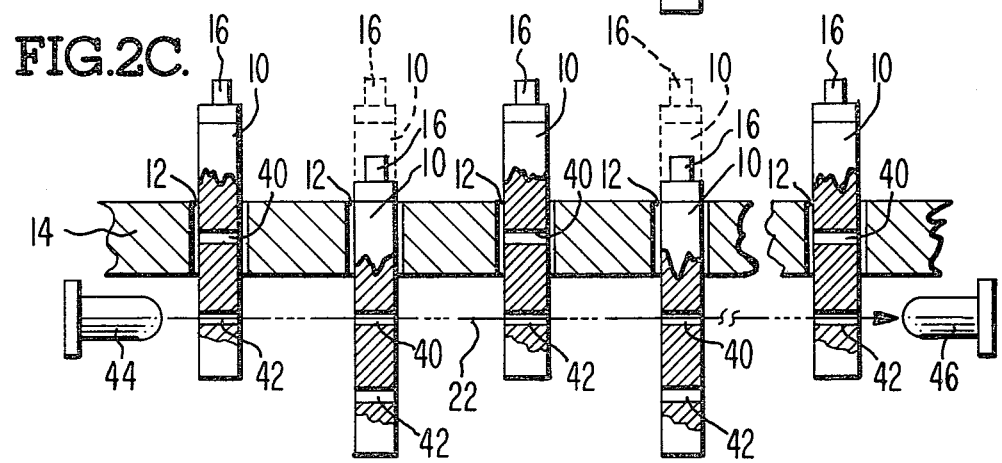

LIGHT TRANSMITY

85 % OPEN

15 % OPEN

PHOTO-OPTICAL KEYBOARD HAVING LIGHT ATTENUATING MEANS

BACKGROUND OF THE INVENTION

1. Field of the Invention

The invention relates to photo optical keyboards. More specifically, the invention relates to an improved key construction to simplify photo-optical keyboard apparatus.

2. Description of the Prior Art

A photo-optical keyboard has a matrix of rows and columns of keys. The keyboard further has a matrix of optical paths (i.e. light channels) with a light channel for each row and each column. A light source is placed at one end of each light channel and a photo receptor at the other end. When a key is depressed the light is blocked in the respective light channel for the row and column of the key. Decoding logic determines which key in the matrix is depressed. The basic principles for the photo-optical keyboards are shown in U.S. Pat. No. 3,056,030.

Up to the present time, no commercial systems have been marketed because of the cost associated with overcoming design and manufacturing problems. Some prior art photo-optical keyboards (U.S. Pat. No. 3,856,127), have attempted to put the light channels for the columns and rows in different planes so that they do not intersect. This requires that the holes either be drilled in a plastic keyboard or that the keyboard be molded in three pieces. Drilling is expensive and the problems of the drill "walking" are present in attempting to drill holes on an angle for a diagonal matrix. Molding the keyboard in three pieces introduces alignment problems because of the warpage and shrinkage of molded plastics.

U.S. Pat. No. 3,796,880 shows an assembly with the light channels formed by sandwiching two plates together. A portion of each of the channels is disposed in each plate. If molded plastic pieces are used, alignment, shrinkage and warpage problems occur at the interface of the plates. This tends to prevent the keys from moving easily and could also cause light leakage between light channels thus producing false signal outputs.

SUMMARY OF THE INVENTION

The present invention provides a key and keyboard construction that overcomes the problems of the prior art and reduces the relatively high manufacturing costs. The present invention is an improved photo-optical keyboard wherein each key stem is provided with an "operational" light channel and a "signal" light channel or passageway therethrough. A separate, individual light source or generator is provided at one end of each row of the keyboard matrix while a light receptor or receiver is co-axially positioned at the opposite end of each corresponding keyboard row so as to intercept light from the light generator when the light beam is activated i.e. the key is in the active position with respect to the light blocking means.

Each key of each column includes a light attenuating, constricting or obstructing element having a light passing member e.g. aperture therein related to the total amount of unobstructed light passing by a prescribed percentage effective to discriminate or delineate each key aperture from its adjacent keys so as to provide an accurate, fixed invariant light signal level output at the associated receptor thus indicating the precise key which has been actuated or depressed.

For details concerning the actual physical construction of a photo-optical keyboard with which the present invention could be operably associated reference may be had to the following filed U.S. patent application assigned to the same assignee as the present application: "Key Switch Actuation By Torsion Spring", Inventor, Justin O. Balta, filed Feb. 26, 1980, U.S. Ser. No. 124,945 now U.S. Pat. No. 4,301,345.

It is an important object of the present invention therefore to provide a novel signal light control means for a photo-optical keyboard matrix which measurably reduces the required parts while increasing signal efficiency and reducing signal output error.

Another important object of the present invention is to decrease the cost of fabrication by requiring only one light source generator and one light receptor or receiver per row e.g. five per conventional keyboard.

Still a further object of the invention is the provision of means integral with the key stem to indicate when the actual operational signal output is to be utilized thus insuring an error free operation of the apparatus.

Another important object of the invention is to provide means for modifying the present photo-optical keyboard keys to accept the novel position indicating light constricting or obstructing means without complete alteration of the photo-optical keyboard system apparatus. Still another object of the invention is the provision of signal multiplexing means effective to reduce the number of electrical circuit elements.

Another object of the invention is the provision of signal means indicating an inoperative condition of the light generating means.

The present invention contemplates the provision of a plurality of parallel, offset, horizontal apertures disposed within the key stem of a vertically movable key and axially oriented such that a beam of light from a light source or generator to a light receiver or receptor alternately can be unobstructed and blocked as the key is vertically, reciprocably moved by an operator.

The light blocking means comprises individual light attenuating or constricting elements introduced within a respective aperture in each key. Each light constricting element is configured so as to permit a prescribed amount of light i.e. percentage of total light from light source generator to photo receptor, to impinge on the respective receptor effective to indicate by signal output to an A to D converter the specified light output and therefore the exact location, column and row, of a specific key actuated in a matrix of rows and columns of keys e.g. a computer keyboard, etc,.

A further embodiment of the present invention provides electrical circuit means for multiplexing the signals from each row in a matrix such that only a single A to D converter is necessary or required for the complete matrix.

BRIEF DESCRIPTION OF THE DRAWINGS

FIGS. 2A, 2B and 2C are views similar to FIGS. 1A thru 1C illustrating in section the signal channel operation of the apparatus in accordance with the present invention;

DETAILED DESCRIPTION OF THE PREFERRED EMBODIMENT

In the earlier referred to and presently pending U.S. patent application U.S. Ser. No. 124,945, a matrix of rows and columns of keys and a keyboard is provided in which light generating devices and photo receptor elements in a ratio of two lights per row and two lights for each column are utilized. In a matrix 6×24 a total of 60 light generator/receptor elements is thus required.

The present invention eliminates both a large number of photo generator/receptor elements but also lowers by a considerable factor the current requirements of a typical keyboard matrix arrangement. As will become more evident as the description proceeds, the present inventive combination employs, for a five row keyboard at two light generators per row, ten light generators and ten light receptors, the percentage of light being received by any one receptor being indicative of the column key depressed.

Figure 1A:
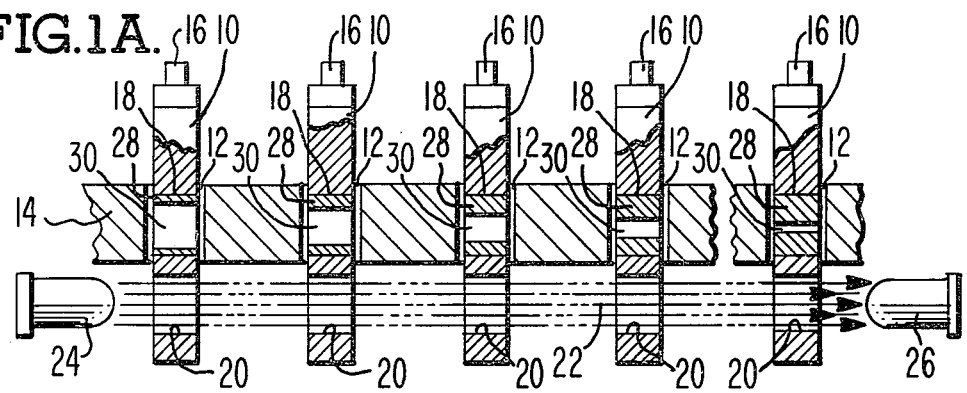
FIGS. 1A, 1B and 1C inclusive are highly diagrammatical, section views of the invention as embodied in a keyboard matrix.
Figure 1B:
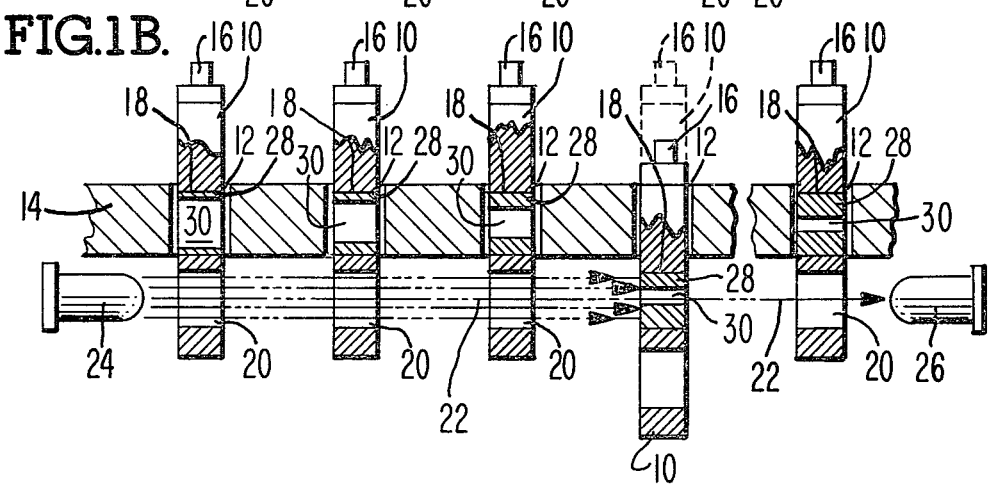
Figure 1C:
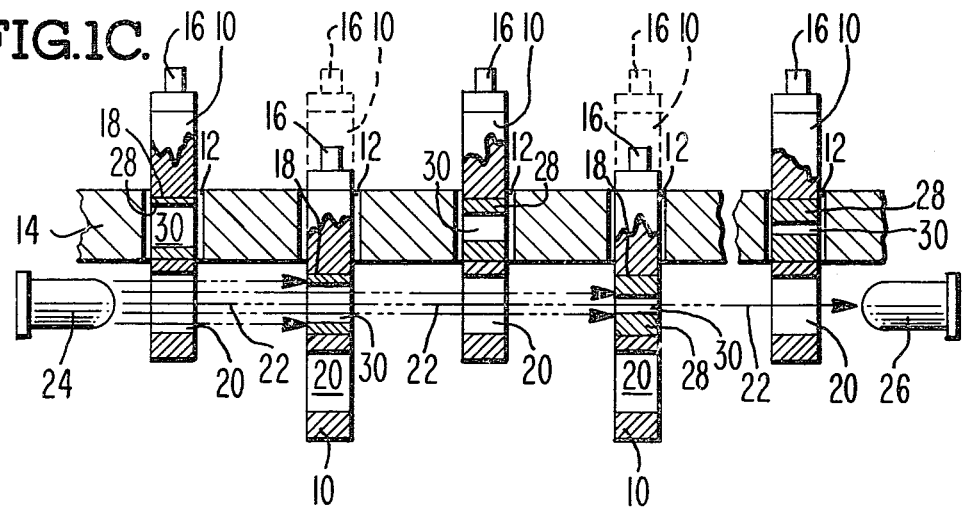

Referring first to FIGS. 1A thru 1C for purposes of clarity only and to avoid confusion which might tend to occur with the depiction of a complete keyboard of five rows of ten or fifteen columns, there is shown schematically and not to scale, a single row of five keys 10 slidably, movable, reciprocably, vertically up and down within individual apertures or openings 12 provided within a keyboard support 14.

Each key comprises a relatively elongated key stem, as shown, having a top portion 16 for mounting, as by press fitting, a key top (not shown) indicating the alpha-numerical data equivalent produced by the depression of that particular key. Intermediate to the ends of the key stem are located an upper and a lower relatively large opening 18 and 20, respectively. As seen in FIG. 1A with the key 10 in the full up position the upper openings or apertures 18 which are axially aligned are all effectively blocked by the walls of each opening 12 in member 14, whereas the lower openings or apertures which, as shown, are similarily all axially aligned and are effectively unblocked so that light 22 from light source or generator 24 can pass through each adjacent opening 20 to impinge upon a photo receptor or receiver 26 at the opposite end of the row.

In order to effectively control the light 22 output from the light generating means 24 to the light receiving means 26 the present invention in one embodiment provides a series of circular, relatively thin, light weight, opaque members 28, which as will be described later on, are disposed within the upper apertures 18, one per key aperture, so as to enclose the respective aperture except for the opening 30 provided in each opaque insert.

Figure 5:
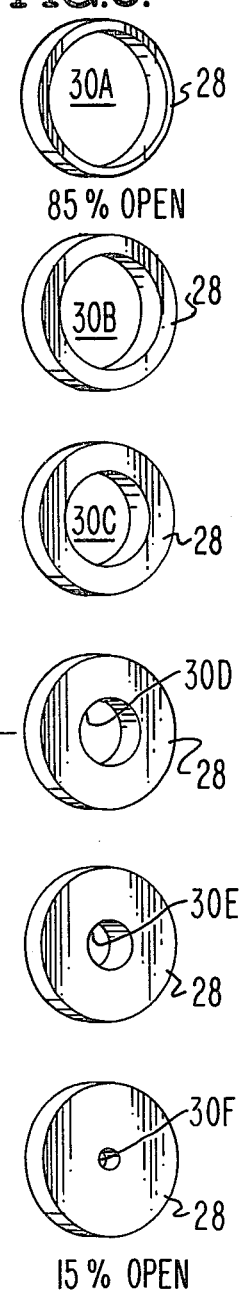
FIG. 5 is an idealized diagrammatic view, not to scale, of light obstructing washer-like elements for the present invention.

Each opaque light blocking member 28, as seen most clearly in FIG. 5, is provided with an aperture therethrough of varying diameter forming an aperture 30A which passes approximately 95 percent of the total light to an aperture 30F which passes approximately 15 percent of the total light. For example, FIG. 1B is illustrative of the situation wherein only a small portion of the light 22 from light generator 24 is permitted to pass through light restricting member 28 to impinge upon light receptor 26. The remainder of the light being blocked by the relatively larger opaque area of member 28.

In FIG. 1C there is illustrated a condition wherein two keys 10 are depressed at the same time (simulatenously) each key bearing a different light obstructing opaque member 28 and each key being capable of passing only the amount of light commensurate with the respective opening 30 therein. In this situation assuming the key with the smaller aperture is depressed first and thereafter a second key having a fairly large aperture is depressed, the net value of the light output would be the small percentage of the larger aperture. A micro processor FIG. 6 in circuit with a decoder driver, a comparator, and A to D converter associated with the keyboard matrix performs the arithmetic functions, all of which will be described later on, so as to produce the exact output indicative of the second key to be depressed. For example, assume that the first key depressed was indicative of a 30 percent value relative to the total light impinging upon the photo receptor. If while this key is depressed the second key having an 80 percent value happens to be depressed then that value would be 30 percent of 80 percent or 24 percent approximately. The micro processor is enabled to perform the arithmetic function to decode back and determine that it was the 80% key that was depressed which now produced the value of 24 percent thus indicating the key combination which produced the combined output for the correct key.

In order to insure that a partially depressed key and therefore, a partially obstructed light or signal channel does not operate to produce a false or inaccurate signal output indication, the arrangement of FIGS. 2A thru 2C is incorporated into the present appratus. An upper and a lower pair of apertures 40 and 42 respectively, are provided in each key stem, disposed in parallel, vertically separated, offset arrangement, as shown. It is evident from this arrangement that the two parallel channels are in alignment only when keys 10 are in either the full up (no key depressed) condition or in the full down (all keys depressed) condition. Thus, as seen in FIG. 2A when light from source 44 can pass through to receptor 46 this is indicative of a valid key depressed condition and therefore, of a valid percentage output of the operational channel. This governs the timing that is employed with the micro processor for producing the voltage output indicating the row and column key depressed. FIG. 2C is similar to FIG. 1C except that it indicates the correct operational channel which is indicated when and if more than one key is depressed.

Figure 3:
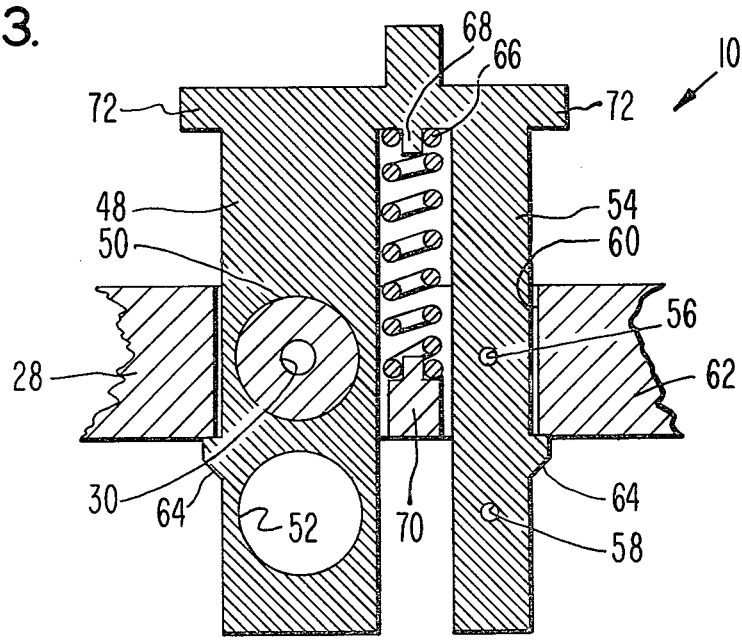
FIG. 3 is a sectional, side elevational idealized, diagrammatic view of one of the keys according to the present invention.

In FIG. 3, which is an enlarged sectional, side elevational view of an idealized key 10, the enlarged left hand portion 48 of the key stem is provided with an upper operational channel 50 into which is disposed, as by press fitting, a washer like, partial light obstructing or blocking, opaque member 28 (FIG. 5) having a light passing aperture 30 therein. Immediately below and extending substantially parallel to opening 50 is located a signal channel 52. On the opposite right hand narrower portion 54 of the key stem are located an upper and a lower signal channel opening 56 and 58 respectively, similar to signal channels 40 and 42 FIGS. 2A thru 2C. Key stem 10 is slidably disposed within an opening 60 in a support member 62, such as a keyboard, and is restrained against vertical upward removal by means of horizontally opposed, parallel ridges 64. A coiled spring 66 constrained at its upper end against movement by the downward projection 68 and at its lower end by the upwardly projecting post 70, permits the key to move up and down as desired. The horizontally projecting edges 72 act as lower limits for the downward key travel as they abut the upper surface of the support 62 in the lower most key depressed position.

Figure 4:
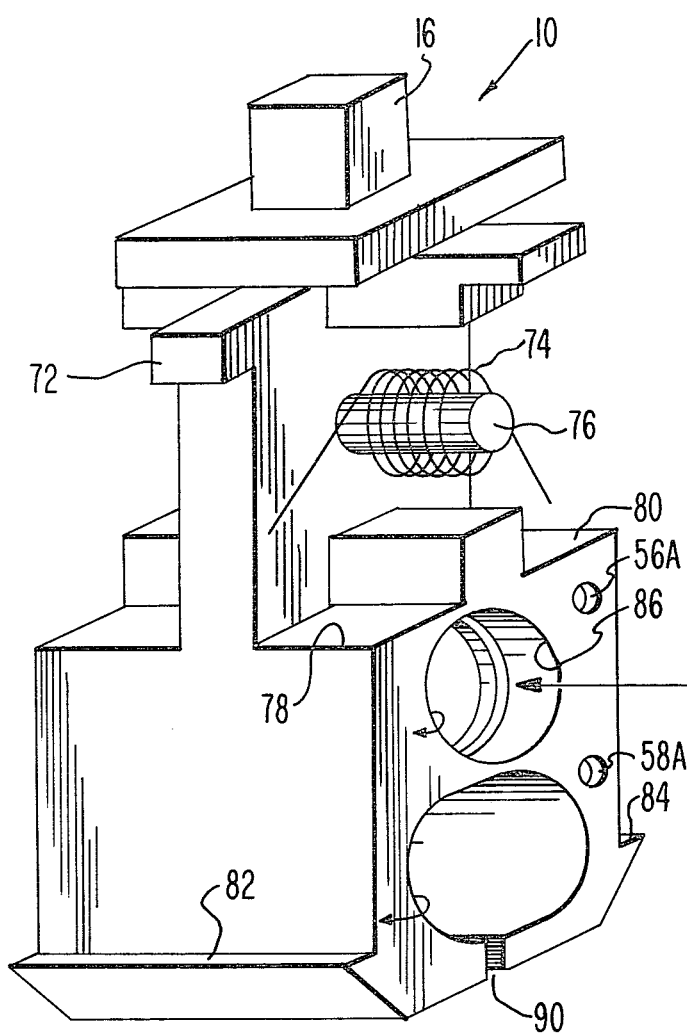
FIG. 4 is an isometric view, not to scale, of a single key embodying the present invention illustrating the two pairs of light channels therein.

FIG. 4 is an isometric view of a preferred embodiment of the key structure 10 according to the teachings of the present invention. The structural arrangement of parts is substantially similar to that of the device illustrated in the sectional view of FIG. 3 with certain obvious differences as will be noted and is similar also to that described in and claimed in co-pending U.S. patent application entitled "Key Switch Actuation By Torsion Spring" in the name of Justin O. Balta U.S. Ser. No. 124,945, filed Feb. 26, 1980 and assigned to the same assignee as the present invention, now U.S. Pat. No. 4,301,345.

The vertically disposed spring 66 of FIG. 3 has been replaced by the torsion spring 74 pivotally mounted on the horizontal pivot post 76. The opposite ends of the spring (in the rest position before insertion into the keyboard) abut the opposite side edges 78 and 80 of the base of the key stem. Horizontal contraining-retaining ridges 82 and 84 at the bottom and 72 at the top prevent the accidental dislodgement or removal of the key stem from the keyboard (not shown) after insertion within the keyboard. Thus, as described more in detail in the previously referred to U.S. application Ser. No. 124,945, now U.S. Pat. No. 4,301,345 when inserted in a keyboard the spring ends engage the edge of the keyboard support opening and are deflected by these edges as the key is moved up and down effectively coiling and uncoiling the spring.

An operational channel 86 is horizontally disposed in the upper portion of the lower solid area of key 10 and extends completely through the member as in the structure of FIGS. 1, 2 and 3. Immediately beneath channel 86 and extending parallel thereto is a signal channel 88 slightly oblate rather than circular as is channel 84. Signal channels 56A and 58B corresponding to channels 56 and 58 in FIG. 3 are likewise provided. The bottom portion of the key stem is bifuracted as in 90 permitting the lower opposite portions of the key stem to deflect slightly so that it may be inserted into the support structure (not shown).

In FIG. 5 there is illustrated by way of example six out of a possible 24 light blocking insert members 28 showing quite clearly the differences in the light passing ability of each with respect to the others. For example, opening 30A is formed so as to admit approximately 85 percent of the light from the source to the receptor while at the opposite end of the scale, opening 30F is seen to admit only 15 percent of the light from the source to the receptor.

The 85 percent and 15 percent values were selected so as to allow for loss of light output with time or dust accumulation on the receiver. The A-D converter and micro processor can easily compare these values with 100 percent and 0 percent to determine limiting values and still provide a margin for error.

Figure 6:
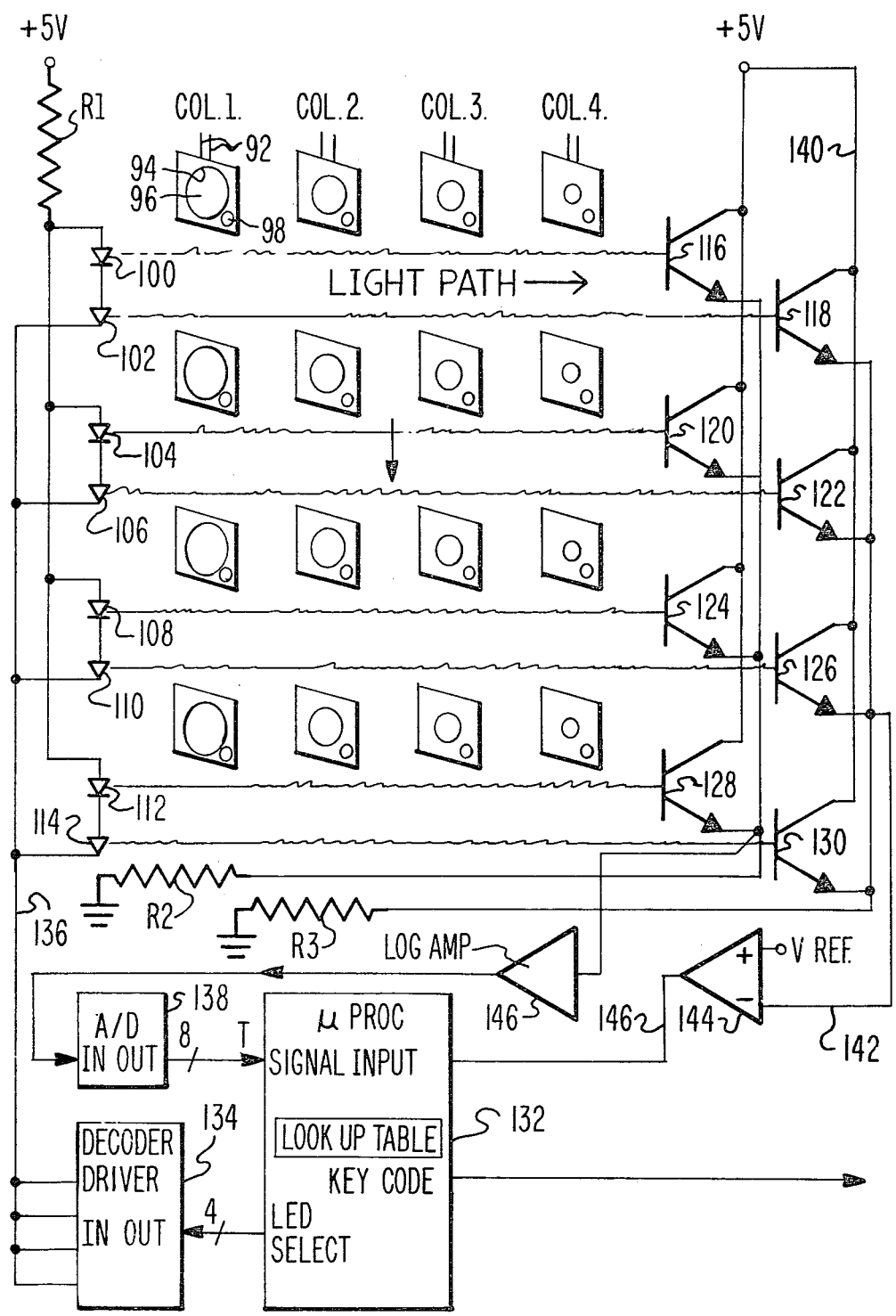
FIG. 6 is a diagrammatic schematic view of the keyboard matrix and electrical circuitry for the electrical operation for the present invention.

FIG. 6 is highly schematic, diagrammatic, illustration of a 4×4 pattern or matrix of LEDs (light generators) and photo transistors (light receptors) showing the active interconnections between various elements of the novel combination. Key stems 92 (only the portion carrying the light attenuating or obstructing elements being illustrated) are arranged in rows and columns with each key stem being provided with an operational channel aperture 94 having a light obstructing member 96 therein and a signal "on-off" channel or aperture 98. Channels 98 are open to the light depending upon the "up or down" position of the key stem 92 relative to the keyboard structure or housing, as earlier described herein with respect to FIGS. 1, 2 and 3.

Arranged in pairs along one side of the keyboard are light emitting diodes 100-102 through 112-114 effective to project light across any unobstructed row to a respective pair of light receiving photo transistors 116-118 through 128-130 inclusive respectively, as will now be described. The keys, as in FIGS. 1, 2 and 3, are vertically movable "up and down" so as to completely obstruct the light in the full "up" position and to completely unblock the light in the full "down" position. A +5 volts (+5 V) potential from a source not shown is applied to each pair of LEDs through resistance $R_1$ and a +5 volts (+5 V) is applied to each photo transistor across load resister $R_2$.

A micro-processor 132 provided with an output port of 4 lines, as seen in FIG. 6, is connected to a decoder driver 134. The micro-processor generates a 4-bit code to "turn on" one of four output lines interconnected to the LEDs over line 136. This applies a potential to turn on one of the LED pairs at a time such that one of the rows now has light coming through to one of the photo transistor pairs 118-130 inclusive. It is noted that when the apparatus is turned "on" it goes into a "scan" mode whereby each LED in turn is turned "on" and, so on, continuously. All the photo transistors are wired in parallel as shown so that those photo transistors which receive no light act in the nature of open circuits whereas the photo transistors that receive a signal send out a current which develops a voltage across the load resistor $R_2$. This latter signal goes to an analog to digital (A to D) converter 138.

When the micro processor 132 initially turns on it starts at the beginning of its program with an initialization procedure in which it turns on the first LED and measures the output signal and stores that in a random access memory (not shown) in the micro processor. It will then turn that LED off and turn the second one on and read the signal and store that signal in the memory and proceed in that manner until all the LEDs have been sampled in all of the rows. When all the LEDs have been turned on one at a time, the resulting output signals are stored in memory. After the micro processor 132 has completed the initialization procedure it goes into the main routine in which it turns on one LED at a time and measures the signal and compares that signal to the value that it originally stored in memory. Note that all keys are in the "up" position in the initialization procedure.

As the micro processor 132 progresses through the "scan" mode if the operator pushes a key down then the micro processor 132 reads a change in the light signal and compares that changed signal to the original signal stored and sees that there has been a change and from the ratio of the two it determines which key in that row is "down". At that point it looks up the key code for that key, the circuitry for detecting or determining when the key is actually down indicating that a reading should be taken, i.e., with the LED of a particular row turned "on" comprises a second set of LEDs 102–114 connected to detectors 118–130. Lines 140 and 142 go to a comparator 144 to determine whether there is a signal generated or not. A second digital line 146 coming into micro processor 132 enables the micro processor to look at these lines and determine whether one of them is "high" or "low" i.e., whether there is a signal or no signal. When there is no signal then it takes the reading from the A to D converter 138 and considers it a valid reading and determines which key is down. A voltage reference is placed on comparator 144 so that if the signal voltage is above the reference value, a "0" is provided, and if it is below the reference value of "1" is produced. Note only the aperature channel 96 goes to the A to D converter 138 and the "on" and "off" or key up, key down channel 98 goes to comparator 144 to indicate whether it is open or closed. In that way when the micro processor 132 addresses one row it turns on two LEDs and samples the comparator channel to determine whether a key is down in that row and if so, then it stores the A to D signal, i.e., "digital word" reads it into the micro processor 132 and then compares it to the original value stored in memory.

Figure 7:
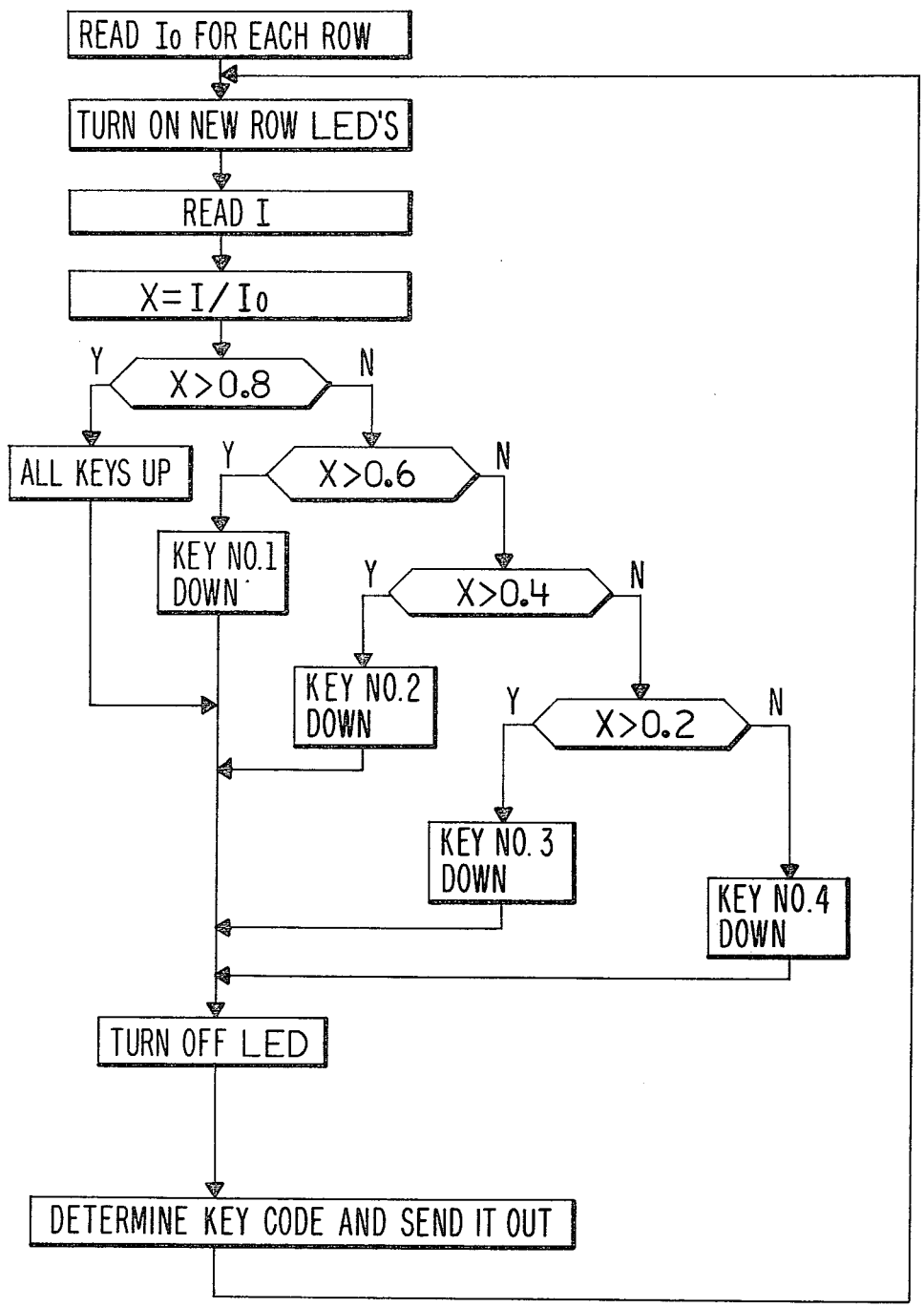
FIG. 7 is a schematic flow diagram for the operation of the present invention.

FIG. 7 is a flowchart for the operation of the subject invention. In the first step the initial values of current for each channel or row are read. Next the LEDs in a new row are turned on. The signal coming out is divided by the initial value and stored as the value X which is processed through a set of logic (not shown). For example, if it is assumed that X was linear and if X was greater than 0.8 then the logic would conclude that all the keys are in the "up" position and the information would progress to the bottom of the flow diagram and turn off that LED. If there as any key "down" it determines the code for that key and sends that key code out to a machine logic to indicate which key is in fact down. Thereafter, a new LED is turned on and this procedure is repeated for the remainder of the keys. This generally would be in chronological order, however, the order is not significant and could be in one, two, or three order down the rows.

Returning to the flowchart logic, if the ratio X is less than 0.8, then it would determine whether the value was greater than 0.6, if it is greater than 0.6 the logic concludes that the first key is down and it would then turn off the LED, determine what the key code is, and send the key code out as before. If on the other hand, it is less than 0.6 the logic makes an inquiry "is it greater than 0.4?" If so, then key 42 is down. The final position asks "is it greater than 0.2?" If it is greater than it concludes that the third key is down. If not it concludes the fourth key is down.

Figure 8:
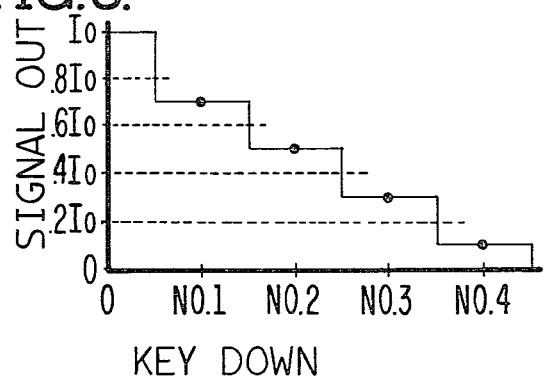
FIG. 8 is an idealized graph of the signal output versus the specific key being depressed.

FIG. 8 is a chart or diagram showing "signal out" versus which key is down (key down). With all the keys up, the ratio would be 1; with all the keys down, it could range between 0.6 and 0.8. It is illustrated in the chart as 0.7 and so on down. This allows for some variation in the signal. For instance, with the ratios shown there is a range of 0.2 of the initial value at each level tolerating signal noise or change in response. If the channel improves or deteroriates, there will be some decrease in the signal but there will still be a useful range for each key. The range is based on the LEDs performance. This is to insure that the correct key indication is provided even though there may be some variation in the performance of the apparatus overall. Since there could possibly be differences and variations in LED-detected performance, a log scale of apertures could be employed. To this end a logrthmic amplifier 146 FIG. 6 is connected ahead of the A to D converter 134. This permits conversion of the signals so as to take the log of the signal and then digitize it.

Figure 9:
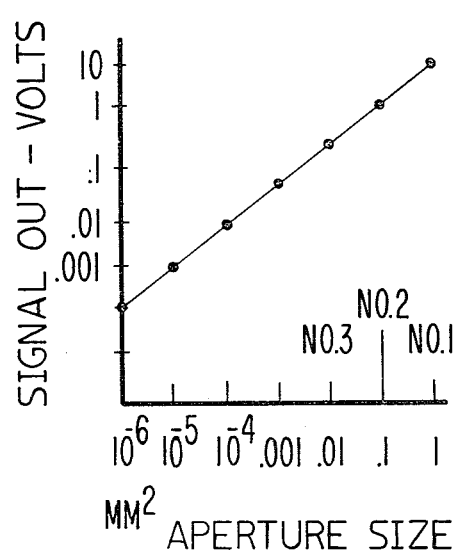
FIG. 9 is a graph-curve of signal output versus aperture size.

Referring to FIG. 9, a graph is illustrated showing "signal out" versus "aperture size". The "signal out" is a log scale, e.g. 10 to 1 volts 10 volts=7 divisions for instance, 0.1, 0.01, 0.001 (0.1=4 divisions, 0.01=3 divisions) and so on. The "aperture size" is also a log scale starting with an aperture size $10^6$ millimeters squared, $10^5$, $10^4$, $10^3$, etc. An aperture size of 0.1 would produce 1 volt out.

Figure 9A:
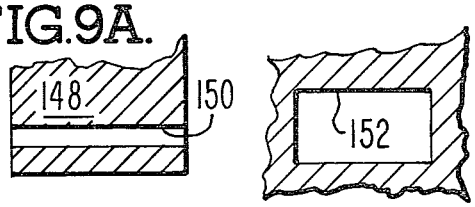
FIG. 9A is a partial sectional view of a modified key and key aperture according to the present invention.

The key modification illustrated in FIG. 9A presents each key 148 with a rectangular aperture 150. When the aperture is moved downwardly into the rectangular channel 152, it is desireable to have the whole aperture in the channel so that the aperture movement does not affect the signal coming through to the receptor at the other end. Thus, for example, if the maximum slit width is one half the channel's height then the aperture can move slightly up and down by one-half the dimension of the rectangular channel without any appreciable affect on the light output. With the constraint that the switching action has to occur within a certain key depression range, it is desirable that the opening height be equal to the switching range, approximately. With a circular orifice, the height versus area ration is large whereas with a rectangular aperture the height to area is small. So more light will be passed through the rectangular channel while keeping the switching region within the desired specifications. Thus, if each one of the apertures is sized according to the chart of FIG. 9, then the signal range for each key would be a factor of 10. A total change of 10 could be tolerated while still being able to correctly identify which key was depressed. By utilizing a "log amplifier" the total range is substantially increased. The increase in range provides a greater margin for error for each key while still enabling detection of the precise key depressed.

Figure 10:
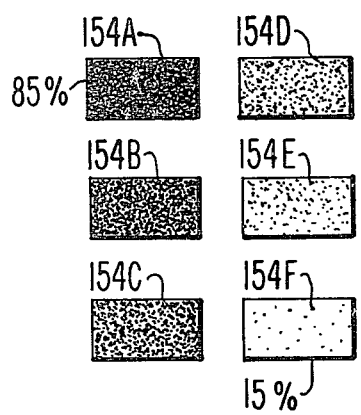
FIG. 10 is a schematic view of a plurality of light attenuating members for the mechanism illustrated in FIG. 9.

A still further exemplification of the idea of utilizing variable light transmission or percentage of total light output is the construction of FIG. 10. In this case all of the openings 50–150 through which light is adapted to pass could be substantially similar, however, each key would be provided with a separate light transmissivity factor, as by a thin film 154a–154f whose opacity, density or light transmitting capability could vary in proportion to a pre-arranged scale or ratio relative to the total light available for transmission from light generator to light receptor. The photo receptor would still operate to generate a signal indicator of the key depressed.

SUMMARY

Since the operation of the present invention is predicated upon percentages of light versus total light from the light source to a receptor the micro processor is provided with a preplanned key location versus percentage of light reduced to an output voltage acceptable to the micro processor. For example, each location of a separate key involves a specific percentage of light being passed from the source to the receptor. This information is burned into the micro processor chip indicating by percentage of light what key is depressed. Thus, when a key is depressed the percentage of light in the form of a voltage output is passed through the micro processor which by means of a suitable "look up" table indicates for example, 50 percent.

Thus, when a key is depressed the micro processor determines what the percentage of light signal is and then goes to the "look up" table to determine the key code. For example, row 2 is turned on and a 50 percent reading obtained indicating key 4 in that row. The micro processor goes to row 2 and column 4 in the "look up" table where the key code for the letter "w" is stored.

In operation of the present invention the micro processor would on a "start up" condition look across and read the values of each of the rows of keys via the series of lower most apertures characterized as a signal or reference channel. This forms a base reference point or signal level with 100 percent of the light passing from the light generator to the respective receptor. Since the basic concept involved with the present invention is to utilize the percentage of the full open channel light thus any key depressed produces some percentage less than 100 percent but greater than say 15 percent to give a reasonable margin for error. This light value in percentage is converted electrically to voltages to drive the D to A converter such than an indication is produced of the key location based on the percentage value presently stored in the processor memory. A comparison instantaneously locates the key by row and column.

As each key is depressed there may possibly be a condition wherein a portion of the operational channel is partially blocked and partially open.

To prevent premature actuation in response to this signal indication two smaller parallel but separated apertures are provided, which as seen, can only be completely aligned in either the "full up" or "full down" position. "Full up" indicates no keys depressed=0 reference. "Full down" indicates a correct key closure or at rest status depending upon the key value. The operational channel is properly and fully obstructed and the percentage indicated is accurate for that position.

There has thus been described a novel photo-optical keyboard pattern arrangement which requires an extremely low and relatively simple part count with relatively expensive parts. The molding of the parts is extremely simple and the assembly is relatively easy and can be accomplished without expensive tooling.

What is claimed is:
1. Photo-optical apparatus comprising,
a matrix of rows and columns of apertures,
slidably movable members arranged for movement within respective ones of said apertures in said matrix,
each of said movable members having oppositely disposed openings therein, said openings being arranged in vertical, parallel, separated pairs,
light generating means,
light receiving means,
said light generating and light receiving means being axially aligned and arranged so that light from the generating means to the receiving means is uninterrupted by said movable members in one position while in another position of said movable members, said light is partially blocked by said movable members, and
means for accurately varying the amount of light transmitted from said light generating means to said light receiving means, said means being disposed in separate ones of said movable members such that a differing but predictable percentage of total light is received by said light receiving means upon the movement of said movable members from a light unblocking position to a partial light blocking position.

2. The invention in accordance with claim 1 wherein said means for varying the amount of light transmitted comprises individual rigid elements disposed within respective apertures arranged in said slidably movable members.

3. The invention in accordance with claim 1 wherein said slidably movable members are arranged to be self-supporting within said matrix.

4. The invention in accordance with claim 3 wherein each of said slidably movable members includes means for constraining said members against accidental dislodgement within said matrix while permitting said members to be removed and replaced as desired.

5. The invention in accordance with claim 1 wherein each of said openings in slidably movable members is in the shape of a rectangle and wherein each opening carries a member varying the light transmitted from member to member.

6. The invention in accordance with claim 5 wherein said means for varying the amount of light transmitted comprises translucent thin film material capable of passing light varying in amount from member to member.

7. The invention in accordance with claim 1 further including electrical circuit means for measuring the difference in the amount of light transmitted from one key to another to detect which key has been depressed or activated and to compensate for and adjust for differences in light receiving signal responses therefrom.

8. The invention in accordance with claim 7 wherein the means for varying the amount of transmitted light comprises thin film members varying in density from key to key with each such member arranged on a seperate key in such a manner as to restrict the light that is transmitted from said light generating means to said light receiving means.

9. Photo-optical apparatus comprising,
a matrix of rows and columns of apertures
slidably movable members arranged for movement within respective ones of said apertures in said matrix,
each of said movable members having oppositely disposed openings therein, said openings being arranged in vertical, parallel, separated pairs,
light generating means,
light receiving means,
said light generating and light receiving means being axially aligned and arranged so that light from the generating means to the receiving means in uninterrupted by said movable members in one position while in another position light is partially blocked by said movable members, means for varying the amount of light transmitted from said light generating means to said light receiving means and wherein said last named means comprises an ordered series each one of which is disposed in a seperate one of said movable members such that a differing but predictable percentage of total light is received by said receiving means upon movement of said movable members from a light unblocking to a partial light blocking position, and multiplexing means for utilizing the light output signal from each light generating means as reflected to a light receiving means in a desired sequence without the need for individual circuit elements for each row and column in said matrix and for deriving a signal indication for a specific position in said matrix.

10. The invention in accordance with claim 9 wherein said light generating means comprises light emitting diodes (LEDs).

11. The invention in accordance with claim 10 wherein said light receiving means comprises photo transistors.

12. Photo-optical apparatus comprising, a matrix of rows and columns of apertures, slidably movable members arranged for movement within respective ones of said apertures in each matrix, each of said movable members having oppositely disposed openings therein, said openings being arranged in vertical, parallel pairs, light generating means, light receiving means, said light generating and light receiving means being axially aligned and arranged so that light from the generating means to the receiving means is uniterrupted by said movable members in one position while in another position light is partially blocked by said movable members, means for varing the total amount of light transmitted from said light generating means to said light receiving means such that a differing but predictable percentage of total light is received by said receiving means upon the movement of said movable members form a light unblocking to a partial light blocking position, and electrical circuit means for initially storing the signals indicating that all the keys are in an up or inactivated position and for receiving and comparing signals generated by the depressed keys effective to provide a key code determining the location and identity of the depressed key.

* * * * *